United States Patent [19]
Maeda

[11] Patent Number: 5,404,056
[45] Date of Patent: Apr. 4, 1995

[54] SEMICONDUCTOR INTEGRATED CIRCUIT DEVICE WITH INDEPENDENTLY OPERABLE OUTPUT BUFFERS

[75] Inventor: Keiichi Maeda, Kawasaki, Japan

[73] Assignee: Kabushiki Kaisha Toshiba, Kawasaki, Japan

[21] Appl. No.: 53,405

[22] Filed: Apr. 28, 1993

[30] Foreign Application Priority Data

Apr. 28, 1992 [JP] Japan .................. 4-109772
Apr. 28, 1992 [JP] Japan .................. 4-109774

[51] Int. Cl.⁶ ......................................... H03K 19/003
[52] U.S. Cl. ........................................ 326/84; 326/83; 326/21; 326/110
[58] Field of Search ............... 307/443, 446, 473, 475, 307/296.1

[56] References Cited

U.S. PATENT DOCUMENTS

| 4,625,129 | 11/1986 | Ueno ................ 307/446 |
| 4,678,943 | 7/1987 | Uragami et al. .......... 307/446 X |
| 5,107,230 | 4/1992 | King ................... 307/443 X |
| 5,132,563 | 7/1992 | Fujii et al. ............ 307/475 X |
| 5,134,311 | 7/1982 | Biber et al. ........... 307/443 X |
| 5,146,118 | 9/1992 | Nakamura et al. ....... 307/475 |

FOREIGN PATENT DOCUMENTS 1284017 11/1989 Japan .
278319 3/1990 Japan .

Primary Examiner—David R. Hudspeth
Attorney, Agent, or Firm—Oblon, Spivak, McClelland, Maier & Neustadt

[57] ABSTRACT

The output signal and control signal from an internal circuit are supplied to a control circuit via an output signal line and a control signal line. The output signal from the control circuit is supplied to a first and second independent output buffer sections via control circuit output signal lines, respectively. The outputs of the first and second output buffer sections are selectively supplied from an output terminal to an external circuit via an output signal line. With this invention, it is possible to selectively use the output buffer sections having an ability according to use. Another semiconductor integrated circuit device comprises an internal circuit, a plurality of output buffers, a control circuit for selectively actuating the output buffers, and a sequential select circuit for sequentially selecting the plurality of output buffers. Because it is possible to selectively bring only an output terminal on which an electric characteristics test is to be conducted into a normal operating state and the other output terminals into a high impedance state, an accurate test can be carried out without impairing the ease of setting the expected value for the output terminals.

7 Claims, 9 Drawing Sheets

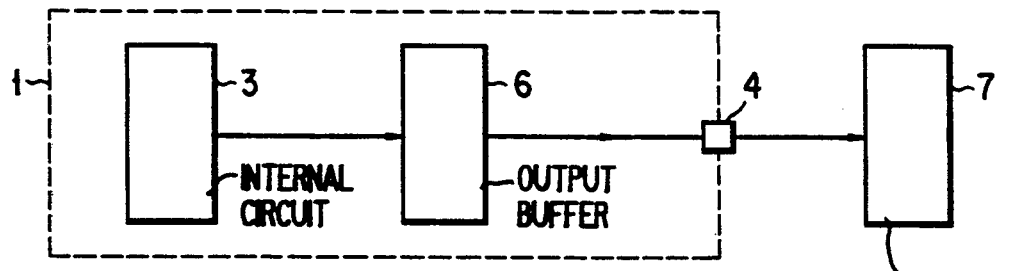
FIG. 1 (PRIOR ART)
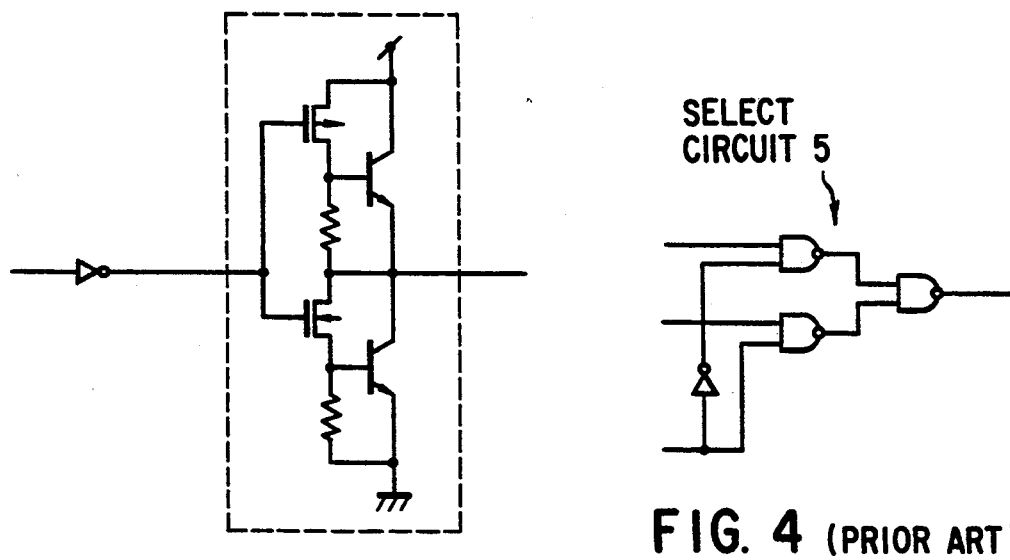
FIG. 2 (PRIOR ART)
FIG. 4 (PRIOR ART)
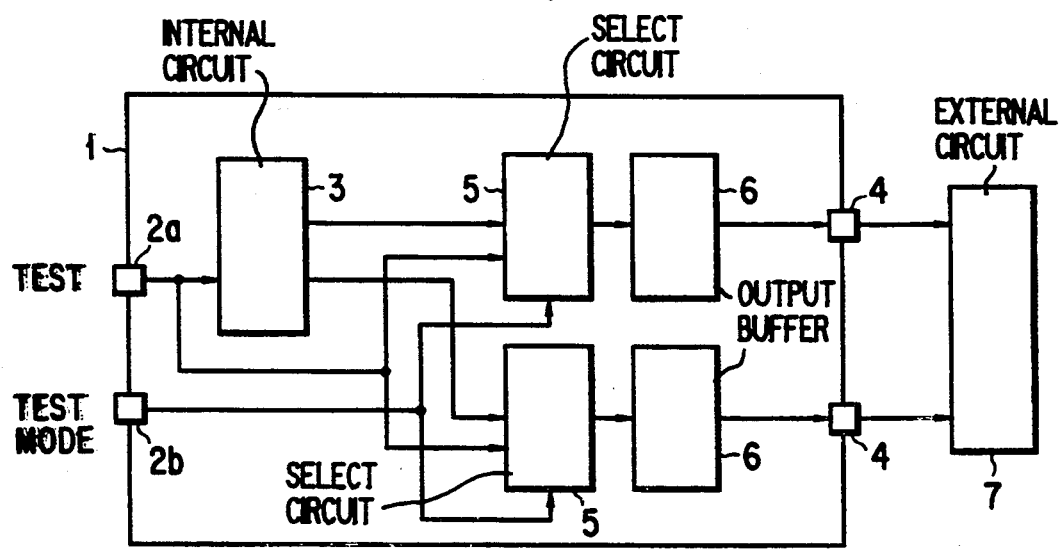
FIG. 3 (PRIOR ART)

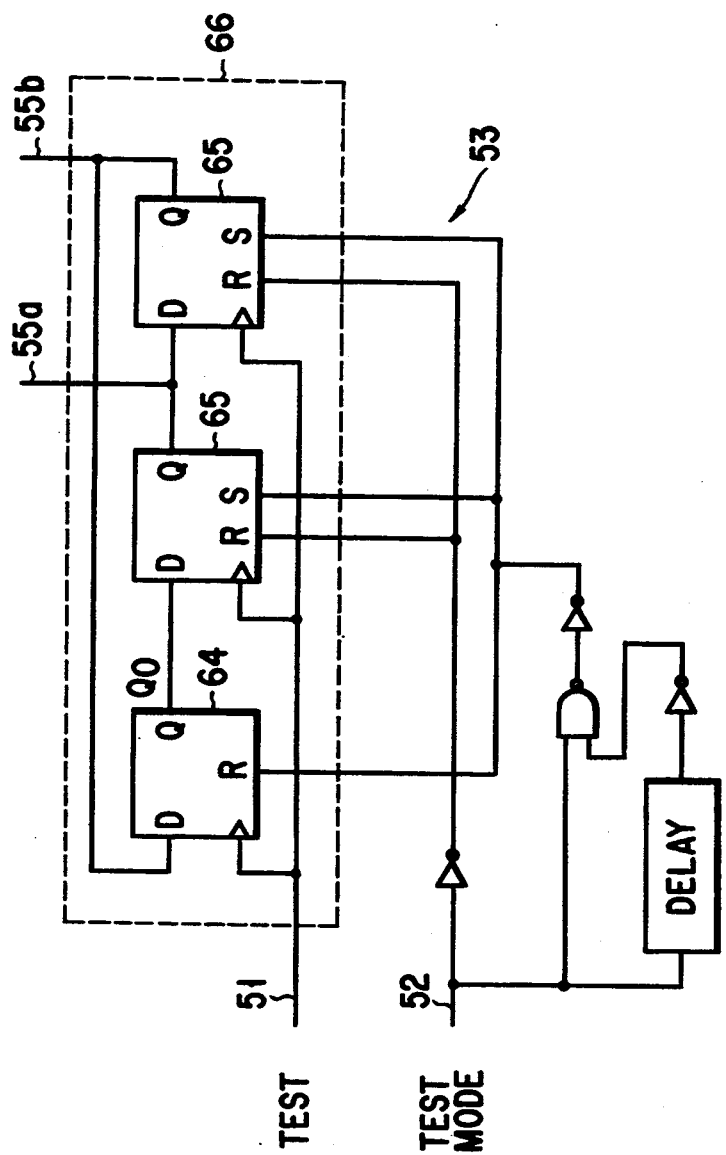
F I G. 14

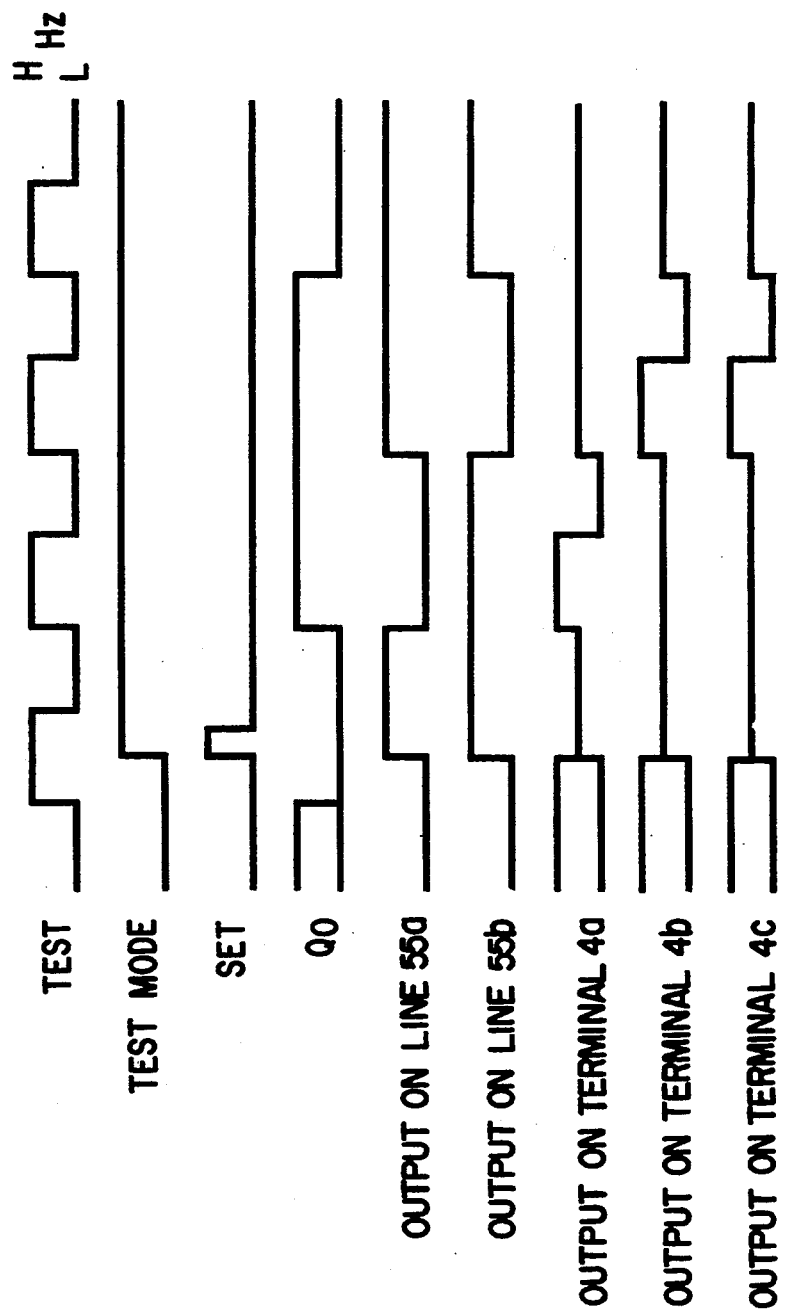

SEMICONDUCTOR INTEGRATED CIRCUIT DEVICE WITH INDEPENDENTLY OPERABLE OUTPUT BUFFERS

BACKGROUND OF THE INVENTION

1. Field of the Invention

This invention relates to a semiconductor integrated circuit device (hereinafter, referred to as an IC) and its test method, and more particularly to an improvement of the output buffers, a function test method of the IC and an electric characteristics test method of the output buffers.

2. Description of the Related Art

A conventional semiconductor integrated circuit device with an output buffer will be explained, referring to an IC block diagram in FIG. 1 and a circuit diagram of a Bi-CMOS output buffer in FIG. 2.

An IC 1 is composed of an internal circuit 3, an output terminal 4, and an output buffer 6 inserted between the internal circuit 3 and the output terminal 4. An output signal is supplied from the output terminal 4 to an external circuit 7. In supplying the output signal from the internal circuit 3 to the external circuit 7, the output buffer 6 functions to match the internal circuit 3 with the external circuit 7. Specifically, the output buffer 6 converts the signal outputted from the internal circuit 3, without changing its value, into a signal having an ability required to actuate the external circuit 7.

FIG. 2 is a detailed circuit diagram of the output buffer of FIG. 1, which is a Bi-CMOS output buffer composed of a CMOS inverter and a Bi-CMOS inverter. The function of the Bi-CMOS output buffer of FIG. 2 is to convert a small current signal in the internal circuit 3 into a large current signal for driving the external circuit 7. In this case, the current driving ability, i.e., the signal ability is made greater through the conversion, but the value of the signal has remains unchanged.

As mentioned above, the output buffer 6 was conventionally made up of a single circuit having only a single function and a single ability. Besides the conversion of the current driving ability, the functions of conventional output buffers include the conversion of a 3-V internal power supply system into a 5-V output power supply system and the conversion of a digital signal into an analog signal. In each conversion, the signal supplied to the output buffer 6, or the signal having the value to be supplied from the IC 1 to the external circuit 7, is converted, without changing its value, into a signal whose ability is suited for the external circuit 7.

In a digital-to-analog converter (hereinafter, referred to as a DAC), although the output signal behaves as if the switching of the power supply systems or the driving current values were being done, that is, the DAC had multiple output buffers and consequent multiple functions and abilities, the DAC output buffer has only a single function and a single ability. For example, the 1-V output and 2-V output are not selectively supplied to multiple external circuits, but either of them is supplied to the same external circuit according to the value of the input signal to the DAC. That is, it is impossible to supply only 1V to a particular external circuit and only 2V to another external circuit, because supplying this way prevents the DAC from operating as it is expected. This is apparent from the fact that for a function test on the DAC, producing only 1V is insufficient for verification. Therefore, the output buffer of the DAC must be regarded as an output buffer with a single independent function.

In the case of an IC using a large-current output buffer, because a large current is allowed to flow even when the load is low, an increase in the power consumption will result. Because a large current is permitted to flow with a low load, noises resulting from overshoot and undershoot are liable to occur due to the effect of the inductance of the wires. This effect can also cause fluctuations in the power supply voltage. Since, during a function test, an ordinary LSI tester runs short of the current capacity for an IC having a conventional large current driving output buffer, accessories including an auxiliary power supply are necessary or a large-current LSI tester must be used, which makes the cost of the function test higher. In another method, since a pattern that prevents simultaneous switching of multiple output buffers must be used, the test time becomes longer. With the recent tendency for the number of IC output pins to increase noticeably, this problem is becoming more serious.

For the output power supply systems, ICs using CMOS output buffers cannot be used for systems using external circuits with ECL input circuits, whereas ICs using ECL output buffers cannot be used for systems using external circuits with CMOS input circuits. These problems have been solved by inserting an interface circuit for converting the voltage systems. This, however, creates new problems of an increased number of components, and consequent increases in the power consumption the board size, the delay time, and other factors. In the case of ICs connected to multiple external circuits having different power supply systems, testing its functions requires multiple power supply systems, which makes it difficult to conduct the test.

As mentioned above, since the output buffer of a conventional semiconductor integrated circuit device is restricted to a buffer with a single function and a single ability, it cannot be helped to use an ability greater than necessary or an external component in order to deal with a low load.

Another conventional semiconductor integrated circuit device with output buffers will be explained, referring to an IC block diagram in FIG. 3 and a circuit diagram of a select circuit in FIG. 4. An IC 1 is composed of input terminals 2a and 2b, an internal circuit 3, output terminals 4, select circuits 5 inserted between the internal circuit 3 and the output terminals 4, and output buffers 6. The output signals are supplied from the output terminals 4 to an external circuit 7. The select circuits 5, which are controlled by the test mode signal supplied to the input terminal 2b, select one of the outputs of the output buffers 6 that is supplied from the output terminal 4 to the external circuit 7 by switching between the individual output signals from the internal circuit 3 and the test signal to the input terminal 2a. Here, the test mode signal is a switching signal for bringing the integrated circuit device into an operating state, whereas the test signal is an input signal for setting an expected value for the output signal. Specifically, by allowing the test mode signal to operate the integrated circuit device and setting the test signal, the expected value for the signal supplied from the output terminal 4 can be set. An electric characteristics test can be carried out by comparing the expected value with the signal actually supplied from the output terminal 4. FIG. 4 is a detailed circuit diagram of the select circuit 5 of FIG. 3, which is made up of a 2-input NAND and an inverter.

An electric characteristics test on the output buffer 6 is carried out by, based on the test mode signal to the input terminal 2b, selecting the test signal to the input terminal 2a as the output of the select circuit 5. Since the output of the select circuit 5, or the test signal to the input terminal 2a whose contents are previously known, is actuated by the output buffer 6 and supplied from the output terminal 4, setting the test signal supplied to the input terminal 2a allows the expected values for the output signals from all the output terminals 4 to be easily set at the same value. In this way, during testing, because all the output terminals supply the output signals of the same expected value according to the test signal supplied to the input terminal 2a, an electric characteristics test can be performed easily in a short time.

It is possible to conduct an electric characteristics test on the output terminal 4 without providing the select circuits 5, by keeping the time required for measurement and the output signal after setting the input signal supplied from the input terminal 2a to the internal circuit 3 to set the output signal from the internal circuit 3, that is, after setting the output signal from the output terminal 4 in a normal operating state. This, however, requires many test patterns for setting the expected values for the output signals from the output terminals 4, which results in a longer time required for the electric characteristics test.

A method is known which has each IC output terminal provided with a 3-value output buffer, and which places an IC in a high-impedance state and tests the other ICs on the board, as disclosed in Published Unexamined Japanese Patent Application No. 3-225845. This method, however, is to insulate one IC from the other ICs with the interconnections kept unchanged, which is nothing to do with testing ICs themselves.

In an electric characteristics test, the capability of the output buffer must be drawn out to the full without restriction. Recently, the power consumption per output terminal has been increasing as the current driving ability of the output buffer becomes larger. In a conventional test method, because multiple output buffers produce outputs simultaneously, running the electric characteristics test involves an enormous amount of power consumption. Therefore, when an ordinary LSI tester is used in such a test, the tester runs short of the current capacity, making the power supply unstable. This limits the value of the output current supplied from the output terminal, which prevents an accurate test. To conduct an accurate test, accessories including an auxiliary power supply are necessary or a large-current LSI tester must be used. With the recent tendency for the number of output pins to increase, this problem is becoming more serious.

As noted above in connection with FIGS. 3 and 4, the conventional semiconductor integrated circuit device and test method of its output buffers have the problem that the simultaneous driving of multiple buffers leads to a shortage of the current capacity, which makes it impossible to conduct the test accurately or requires an additional part to be attached externally.

SUMMARY OF THE INVENTION

Accordingly, an object of the present invention is to eliminate the above drawbacks and provide an IC having an output buffer capable of switching functions and/or capabilities according to use.

The foregoing object is accomplished by providing an IC comprising: an internal circuit; output buffer means composed of at least a first and second independent output buffers and inserted between the internal circuit and an output terminal from which an output signal is supplied to an external circuit to match the internal circuit with the external circuit; and a control circuit for switching between the first and second output buffers.

In the IC, the first output buffer has a greater current driving ability than that of the second output buffer.

Further, in the IC, the first buffer is composed of a Bi-CMOS circuit and the second output buffer is composed of a CMOS circuit.

Still further, in the IC, the first output buffer is actuated by a first power supply voltage and the second output buffer is actuated by a second power supply voltage different from the first power supply voltage.

The foregoing object is also accomplished by providing an IC functional test method comprising the step of, during a test, causing a first output buffer suitable for the test to perform a normal operation while placing the other buffers in a high impedance state.

With an IC of the present invention thus constructed, since actuating the control circuit causes the multiple independent buffers in the IC to be switched, it is possible to selectively use the output buffers having an ability according to the characteristics and use for external circuits to which the IC's output is supplied.

Another object of the present invention is to provide an IC capable of an accurate test and easy setting of an expected value for an output signal as well as an easy, accurate electric characteristics test method of output buffers.

The foregoing object is achieved by providing a semiconductor integrated circuit device comprising: an internal circuit; a plurality of output buffers; a plurality of control circuits; and a sequential select circuit for sequentially selecting the plurality of output buffers.

In the semiconductor integrated circuit device, the output signals from the sequential select circuit are connected to the plurality of control circuits, respectively.

Further, in the semiconductor integrated circuit device, at least one of the output signals from the sequential select circuits is connected to all of the plurality of control circuits.

The foregoing object is also achieved by providing an electric characteristics test method of a semiconductor integrated circuit device, comprising the steps of:
  bringing only the selected one of a plurality of output buffers into a normal output state and the other output buffers into a high impedance state to test the selected output buffer in the normal output state; and
  changing the selected output buffer to test a desired output buffer.

In the electric characteristics test method of a semiconductor integrated circuit device, all of the plurality of output buffers are individually selected during the output buffer selection.

Further, in the electric characteristics test method of a semiconductor integrated circuit device, more than one of the output buffers are selected simultaneously at least once during the output buffer selection.

With an IC of the present invention thus constructed, because only an output buffer or terminal on which an electric characteristics test is to be run can be selectively placed in a normal operation state with the other output terminals in a high impedance state, it is possible to make the power consumption smaller during the test. Therefore, it is possible to conduct an accurate test without impairing the ease of setting an expected value for the output terminal.

In addition, sequential switching of the output terminals to be selected allows all the output terminals to be tested easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a block diagram of a prior art integrated circuit semiconductor device with an output buffer;

FIG. 2 shows a circuit diagram of the output buffer in the semiconductor device of FIG. 1;

FIG. 3 shows a block diagram of another prior art integrated circuit semiconductor device with an output buffer;

FIG. 4 shows a circuit diagram of the select circuit in the semiconductor device of FIG. 3;

FIG. 14 shows a circuit diagram of the sequential select circuit in the semiconductor device of FIG. 13; and FIG. 15 shows a signal chart of the operation of the semiconductor device of FIG. 13 and 14.

DETAILED DESCRIPTION OF THE PREFERRED EMBODIMENTS

Referring to FIGS. 5 through 8, embodiments of the present invention will be explained.

Figure 5:
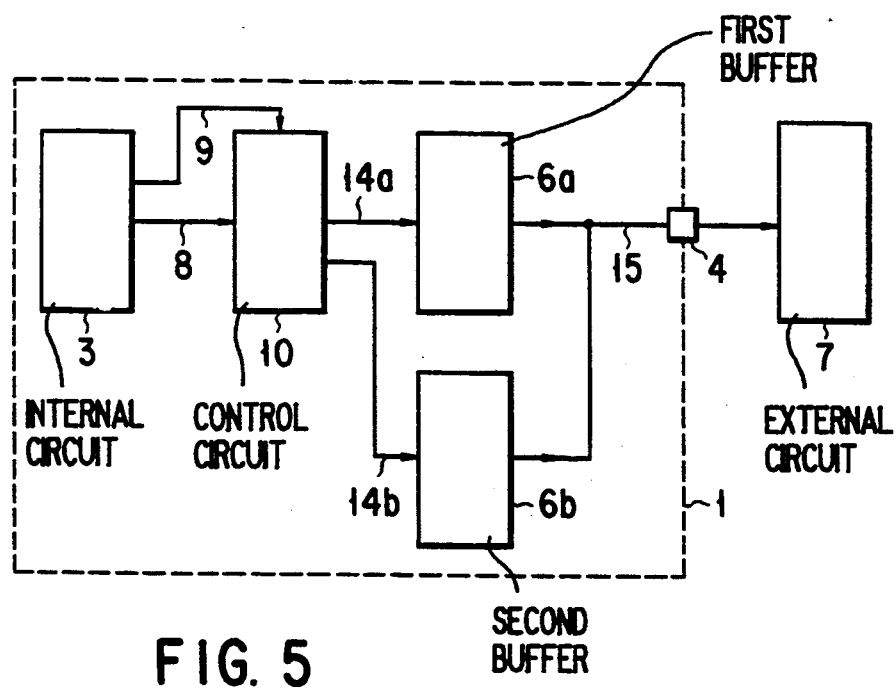
FIG. 5 shows a block diagram of an integrated circuit semiconductor device of an embodiment according to the present invention.

FIG. 5 is a block diagram of an embodiment of the present invention. The output signal and the control signal from an internal circuit 3 in an IC 1 are supplied to a control circuit 10 via an internal circuit output signal line 8 and an control signal line 9, respectively. The output signals from the control circuit are supplied to a first output buffer section 14a and a second output buffer section 14b via control circuit output signal lines 14a and 14b, respectively. The outputs of the first and second output buffer sections 14a and 14b are supplied from an output terminal 4 to an external circuit 7 via a common output signal line 15. While in FIG. 5, the control signal is supplied from the internal circuit 3, it may be supplied externally.

Specifically, based on the control signal from the control signal line 9, the control circuit 10 operates. Either the first output buffer section 14a or the second output buffer section 14b is selected according to the control circuit output signal. The output signal from the internal circuit 3 passes through the internal circuit output signal line 8, the control circuit 10, and the selected one of the first output buffer section 14a and the second output buffer section 14b, and is supplied to the external circuit 7.

Figure 6:
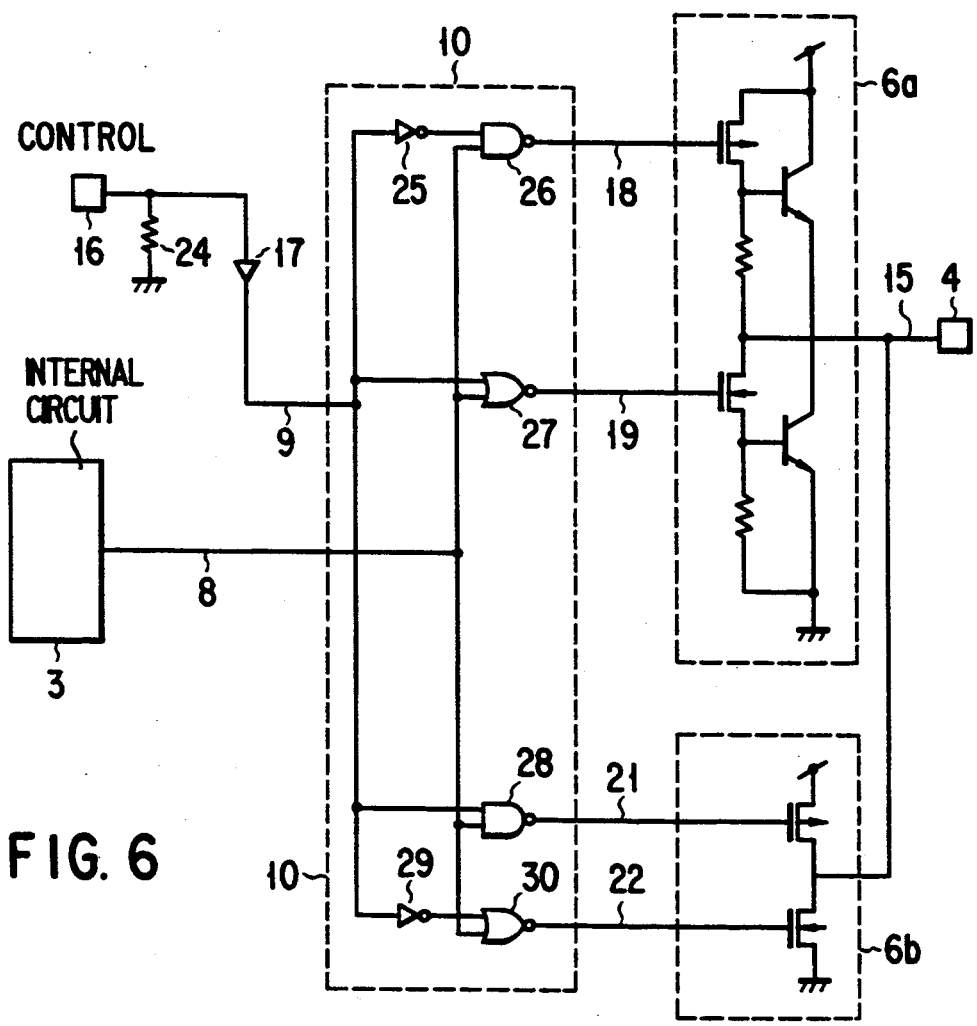
FIG. 6 mainly shows a circuit diagram of the control circuit and the output buffers in the semiconductor device of FIG. 5.

FIG. 6 shows an example of using a Bi-CMOS output buffer as the first output buffer section 14a and a CMOS output buffer as the second output buffer section 14b in the above embodiment. In FIG. 6, it is assumed that the control signal is externally supplied via a control signal input terminal.

The signal input at the control signal input terminal 16 is supplied as the control signal from the control signal line 9 to the control circuit 10 via an input buffer 17. The output signal from the internal circuit 3 is supplied from the internal circuit output signal line 8 to the control circuit 10. The output signals of the control circuit 10 are supplied to a large current output buffer 6a serving as the first output buffer section via the control circuit output signal lines 18 and 19, and to a small current output buffer 6b serving as the second output buffer section via the control circuit output signal lines 21 and 22, respectively. The outputs of the large current output buffer 6a and the small current output buffer 6b are supplied from the common output terminal 4 via the output signal line 15.

To supply a small current signal from the output terminal 4, the control signal to the control signal input terminal 16 is made high. To supply a large current signal, it is made low. In another method, to supply a large current signal, the control signal input terminal 16 is left open and the signal supplied to the control circuit 10 is made low by a pull-down resistance 24.

When the input from the control signal input terminal 16 is high, the control signal is high and thus, the one from the control circuit output signal line 18 of the outputs of the control circuit 10 is made high by an inverter 25 and a 2-input NAND 26, whereas the signal from the control circuit output signal line 19 is made low by a 2-input NOR 27. This brings the output of the large current output buffer section 6a into a high impedance state, which prevents a large current signal from being supplied. Because the signals supplied from the control circuit output signal lines 21 and 22 of the outputs of the control circuit 10 have the opposite logic to that of the internal circuit output signals, the small current output buffer section 6b acts as an inverter, the output of which has the same logic as that of the internal circuit output signal. Therefore, the output signal from the output terminal 4 is the small current signal from the small current output buffer section 6b.

When the input from the control signal input terminal 16 is low, the control signal is low and thus, the one from the control circuit output signal line 21 of the outputs of the control circuit 10 is made high by a 2-input NAND 28, whereas the signal from the control circuit output signal line 22 is made low by an inverter 29 and a 2-input NOR 30. This places the output of the small current output buffer section 6b in a high impedance state, which prevents a small current signal from being supplied. Because the signals supplied from the control circuit output signal lines 18 and 19 of the outputs of the control circuit 10 have the opposite logic to that of the internal circuit output signals, the large current output buffer section 6a acts as an inverter, the output of which has the same logic as that of the internal circuit output signal. Therefore, the output signal from the output terminal 4 is the large current signal from the large current output buffer section 6a.

In the embodiment of FIG. 6, where a Bi-CMOS output buffer is used as the first output buffer 6a, and a CMOS output buffer is used as the second output buffer 6b, the current driving abilities are switched. The power supply voltages for the first and second output buffers may be made different to provide the switching of the power supply systems.

Figure 7:
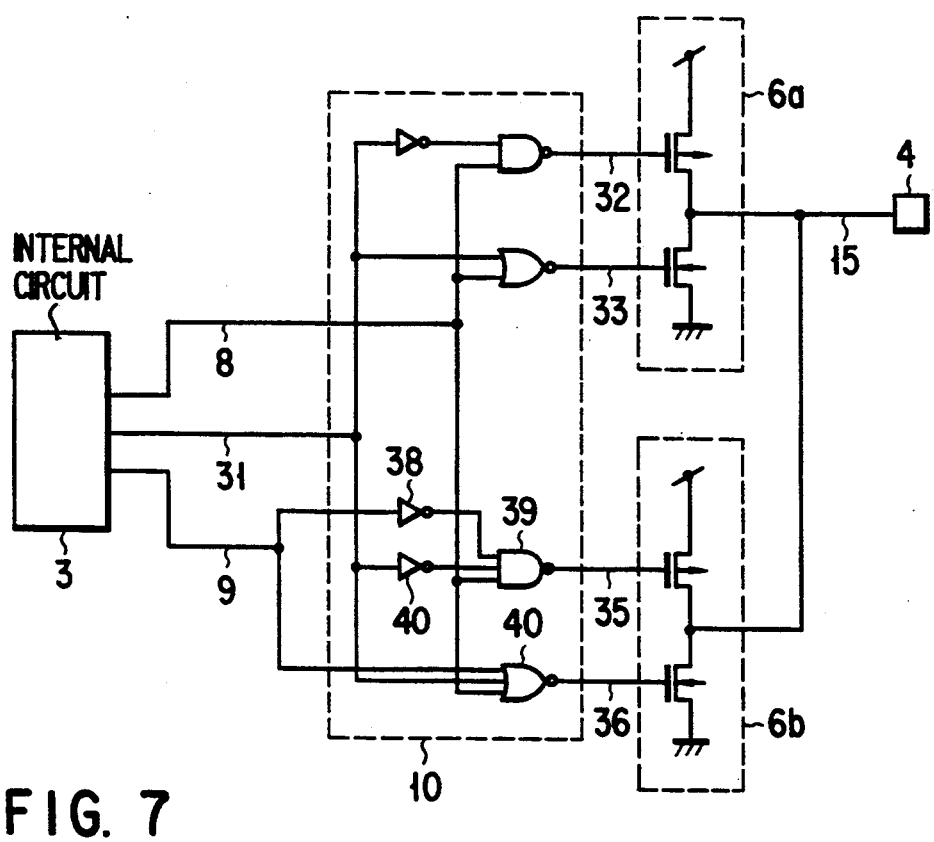
FIG. 7 mainly shows another circuit diagram of the control circuit and the output buffers in the semiconductor device of FIG. 5.

FIG. 7 shows an embodiment of the present invention in which CMOS 3-value output buffers are used for the first and second output buffers 6a and 6b.

The output signal, control signal, and 3-value control signal from an internal circuit 3 are supplied to a control circuit 10 via an internal circuit output signal line 8, a control signal line 9, and a 3-value control signal line 31, respectively. The output signals from the control circuit 10 are supplied to a first output buffer section 6a via control circuit output signal lines 32 and 33, and to a second output buffer section 6b via control circuit output signal lines 35 and 36, respectively. The outputs of the first and second output buffer sections 6a and 6b are supplied from an output terminal 4 via a common output signal line 15. The control signal and 3-value control signal may be supplied from independent external terminals.

To supply a small current signal from the output terminal 4, the control signal on the control signal line 9 is made high. To supply a large current signal, it is made low. To place the output terminal 4 in a high impedance state, the 3-value control signal on the 3-value control signal line 31 is made high.

When the control signal is high, the one from the control circuit output signal line 35 of the outputs of the control circuit 10 is made high by an inverter 38 and a 3-input NAND 39, whereas the signal from the control circuit output signal line 36 is made low by a 3-input NOR 40. This brings the output of the second output buffer section 6b into a high impedance state regardless of the output signal and 3-value control signal from the internal circuit 3, which prevents a current signal from being supplied. The signals supplied from the control circuit output signal lines 32 and 33 of the outputs of the control circuit 10 are determined by the output signal and 3-value control signal from the internal circuit 3, and the first output buffer section 6a is in a normal operation. Thus, the output signal from the output terminal 4 is a small current signal.

When the control signal is low, the output of the control circuit 10 is determined by the output signal and 3-value control signal from the internal circuit 3, which allows both the first and second output buffer sections 6a and 6b to be in a normal operation at the same time. Thus, the output signal from the output terminal 4 is a large current signal.

In the embodiment of FIG. 7, the different abilities that the output buffer sections have are that obtained when only the first output buffer section is actuated and that obtained when both the first and second output buffer sections 6a and 6b are actuated. The first and second output buffer sections 6a and 6b have the same function. Therefore, the first and second output buffer sections 6a and 6b may have the same abilities or different abilities.

As an example of an application of the embodiments of FIGS. 6 and 7, a function test on a semiconductor integrated circuit device is conducted with a small current output so as not to put a burden on the jig and LSI tester used. Then, in actual use, a large current signal is allowed to flow. This test method does not require a large current tester, a special jig, or an auxiliary power supply. Since it is not necessary to make a special pattern that prevents the large current output buffers from switching simultaneously, it is possible to shorten the test time.

Figure 8:
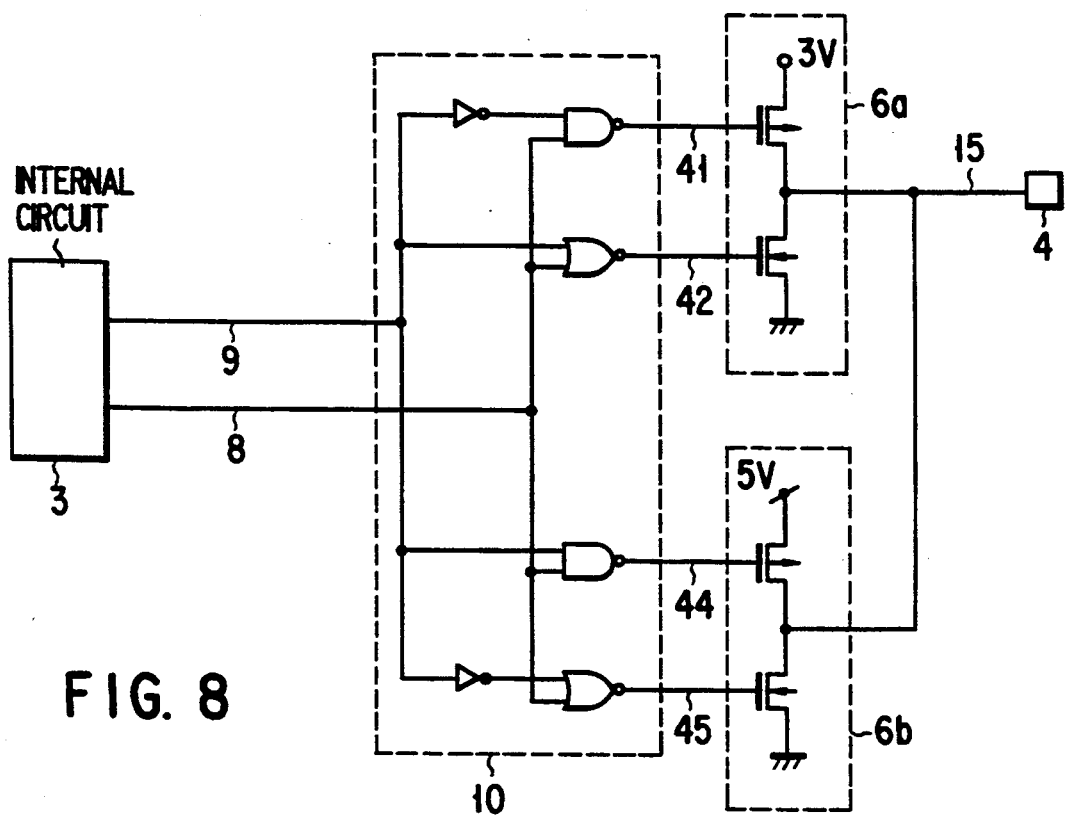
FIG. 8 mainly shows a further circuit diagram of the control circuit and the output buffers in the semiconductor device of FIG. 5.

FIG. 8 shows an embodiment where the present invention is applied to output buffers for switching the power supply systems.

The output signal and control signal from an internal circuit 3 are supplied to an control circuit 10 via an internal circuit output signal line 8 and a control signal line 9, respectively. The output signal from the control circuit 10 is supplied to a 3-V output buffer section 6a acting as the first output buffer section via control circuit output signal lines 41 and 42, and to a 5-V output buffer section 6b acting as the second output buffer section via control circuit output signal lines 44 and 45. The outputs of the 3-V output buffer section 6a and the 5-V output buffer section 6b are supplied from an output terminal 4 via a common output signal line 15. The control circuit 10 operates from a 5-V power supply system, and the internal circuit 3 operates from a 3-V power supply system. The control signal may be supplied from an independent external terminal.

To make the output signal from the output terminal 4 a 5-V voltage signal, the control signal on the control signal line 9 is made high. To make the same output signal a 3-V voltage signal, the control signal is made low.

The control circuit 10, which is the same as that of FIG. 6, brings the output of the 3-V output buffer section 6a into a high impedance state when the control signal is high, thereby causing the 5-V output buffer section 6b to perform a normal operation. When the control signal is low, it places the output of the 5-V output buffer section 6b in a high impedance state, thereby causing the 3-V output buffer section 6a to perform a normal operation.

As an example of a function test using the FIG. 8 embodiment, when the external circuits comprise ICs operating from a 5-V power supply system and ICs operating from a 3-V power supply system, using only either the 3-V power supply or the 5-V power supply makes it easy to conduct the function test.

The present invention is not limited to the above embodiments, where there are two output buffers. Three or more output buffers may be used.

With the above embodiments, it is possible to select and use a plurality of independent buffers having abilities according to uses for the external circuits connected to a semiconductor integrated circuit device. In addition, an easy, accurate functional test can be conducted.

Figure 9:
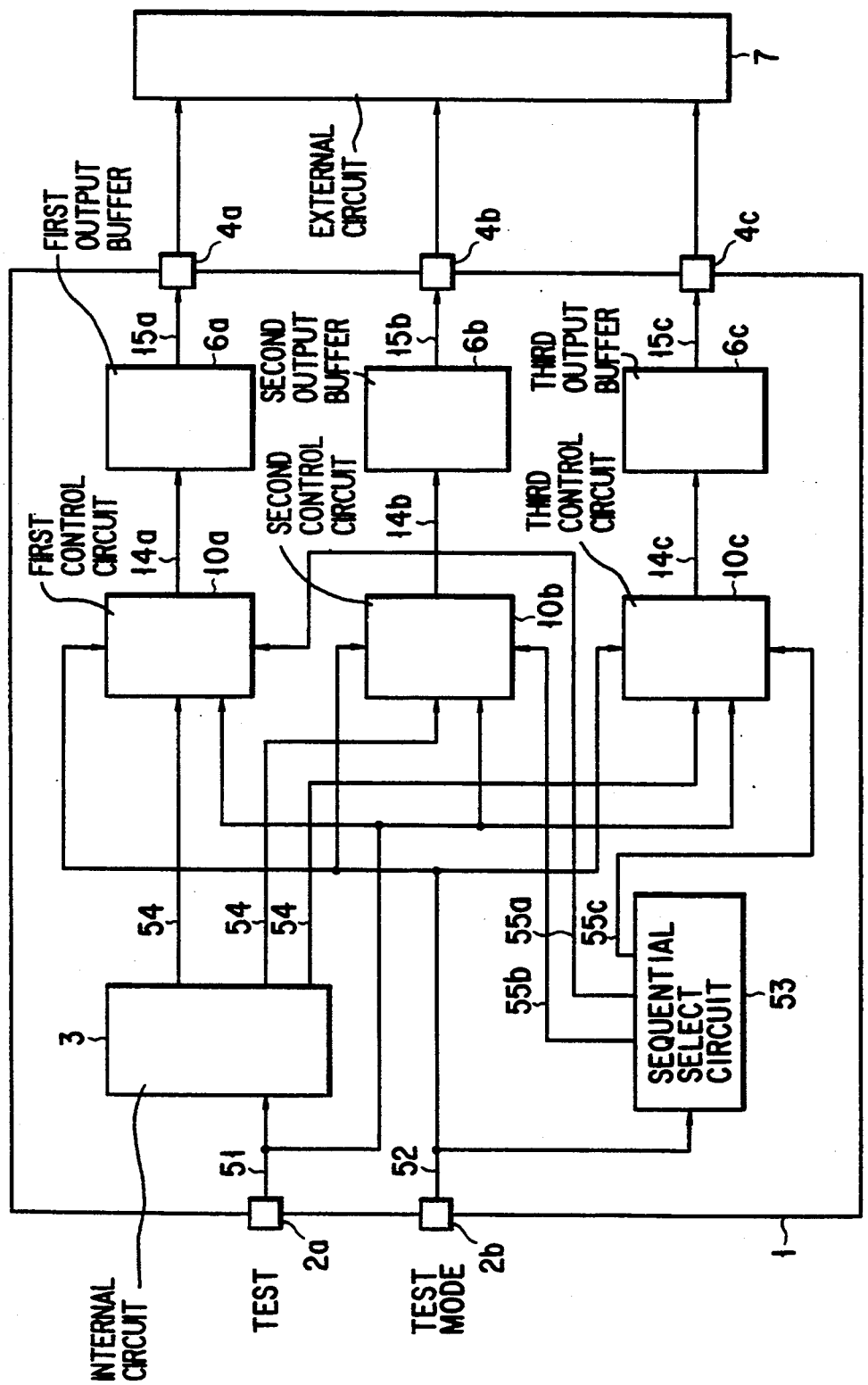
FIG. 9 shows a block diagram of an integrated circuit semiconductor device of another embodiment according to the present invention.

FIG. 9 shows still another embodiment of the present invention. The test signal supplied from a first input terminal 2a to an IC 1 is supplied to an internal circuit 3 and a first, second, and third control circuits 10a, 10b, and 10c via an input signal line 51. The test mode signal at a second input terminal 2b is supplied to the first, second, and third control circuits 10a, 10b, and 10c and a sequential select circuit 11 via an input signal line 52. The internal circuit output signal from the internal circuit 3 is supplied to the first, second, and third control circuits 10a, 10b, and 10c via an internal circuit output signal line 54. The sequential select signal from the sequential select circuit 53 is supplied to the first, second, and third control circuits 10a, 10b, and 10c via a first, second, and third sequential select signal lines 55a, 55b, and 55c. The control circuit output signals from the first, second, and third control circuits 10a, 10b, and 10c are supplied to a first, second, and third output buffers 6a, 6b, and 6c via a first, second, and third control circuit output signal lines 14a, 14b, and 14c. The outputs of the first, second, and third output buffers 6a, 6b, and 6c are supplied from a first, second, and third output terminals 4a, 4b, and 4c to an external circuit 7 via a first, second, and third output signal lines 15a, 15b, and 15c.

The operation of the above device of FIG. 9 will be explained. Based on the sequential select signals supplied from the sequential select circuit 53 via the first, second, and third sequential select signal lines 55a, 55b, and 55c, the first, second, and third control circuits 10a, 10b, and 10c sequentially select the first, second, and third output buffers 6a, 6b, and 6c. The selected one of the first, second, and third output buffers 6a, 6b, and 6c performs a normal operation, whereas the unselected output buffers are placed in a high impedance state. Further, the first, second, and third control circuits 10a, 10b, and 10c, based on the test mode signal supplied from the second input terminal 2b via the input signal line 52, select the internal circuit output signal supplied from the internal circuit 3 via the internal circuit output signal line 54 and the test signal supplied from the first input terminal 2a via the input signal line 51. That is, the control circuits 10a, 10b, and 10c select the output signal from the internal circuit 3 or the test signal, depending on the state of the test mode signal. The selected signal is supplied to the first, second, or third output buffer 6a, 6b, and 6c corresponding to one of the first, second, and third control circuits 10a, 10b, and 10c that is selected by the sequential select signal. Specifically, during a normal operation, not in a test operation, all the first, second, and third output buffers 6a, 6b, and 6c are brought into a normal operation state. During testing, however, only the output buffer selected by the sequential select circuit 53 is placed in a normal operation state. The sequential select circuit 53 can select an output buffer by sequentially switching a given number of output buffers 6 in synchronization with a clock signal.

Since in an electric characteristics test, only the selected output buffer 6 provides current drive with the unselected output buffers 6 just in a high impedance state. it is possible to give the current capacity a margin and make it easy to set the expected value for the output using the test signal.

While in FIG. 9, the test signal and the test mode signal are supplied from the first and second input terminals 2a and 2b, respectively, and then distributed to separate circuits, each circuit may be provided with an input terminal. Although the test mode signal is a single input signal, multiple mode signals may be used to obtain the test mode by decoding. Similarly, the signal supplied to the sequential select circuit 53 may be the test mode signal, the test signal, the clock signal for operating the sequential circuit 53, or a combination of them. Further, the number of output terminals is not limited to three terminals, but may be as many as desired.

Figure 10:
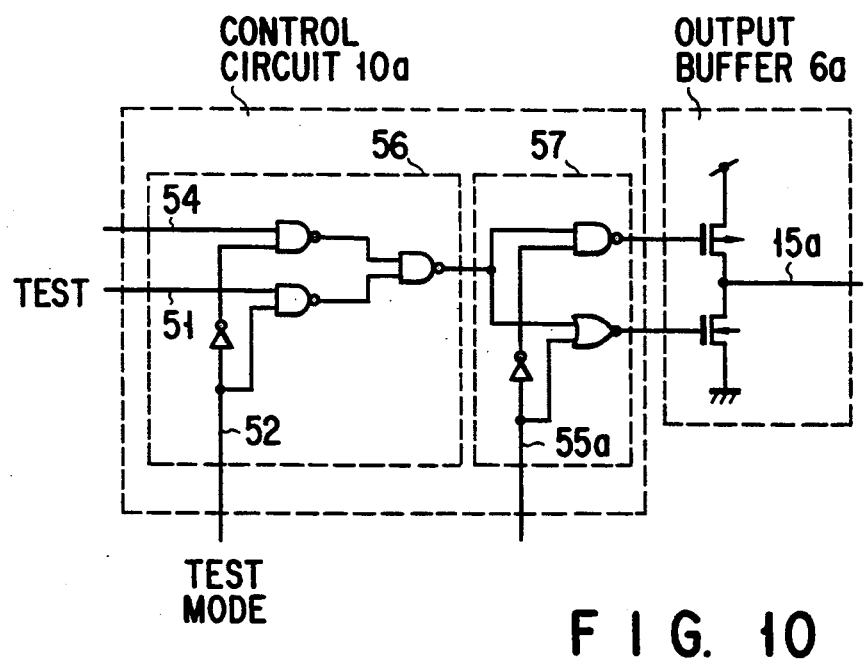
FIG. 10 shows a circuit diagram of the control circuit and the output buffer in the semiconductor device of FIG. 9.

FIG. 10 is a detailed circuit diagram of the first control circuit 10a and the first output buffer 6a shown in FIG. 9. The second and third control circuits 10b and 10c and the second and third output buffers 6b and 6c may have either the same arrangement as or a different arrangement from that of the first control circuit 10 and the first output buffer 6a, respectively. The first control circuit 10a is composed of a select circuit 56 made up of a 2-input NAND and an inverter, and a 3-value output control circuit 57 made up of an inverter, a 2-input NAND, and a 2-input NOR. The first output buffer 6a is composed of a CMOS inverter.

In FIG. 10, to cause the first output buffer 6a to perform a normal operation, the sequential select signal supplied via a first sequential select signal line 55a is made low, whereas to place the first output buffer in a high impedance state, the sequential select signal is made high. For the signal supplied to the first output buffer 6a, the test signal supplied via the input signal line 51 is selected by making the test mode signal supplied via the input signal line 52 high, whereas the internal circuit output signal supplied via the internal circuit output signal line 52 is selected by making the test mode signal supplied via the input signal line 52 low.

While in FIG. 10, the select circuit 56 is composed of a 2-input NAND and an inverter, it may be constructed of various logic circuits such as clocked inverters or composite gates. Similarly, the 3-value output control circuit 57 may also be constructed of various logic circuits. Although the first output buffer 6a is made up of a CMOS inverter, it may be composed of various elements, such as a Bi-CMOS output buffer or a fully NMOS output buffer.

Figure 11:
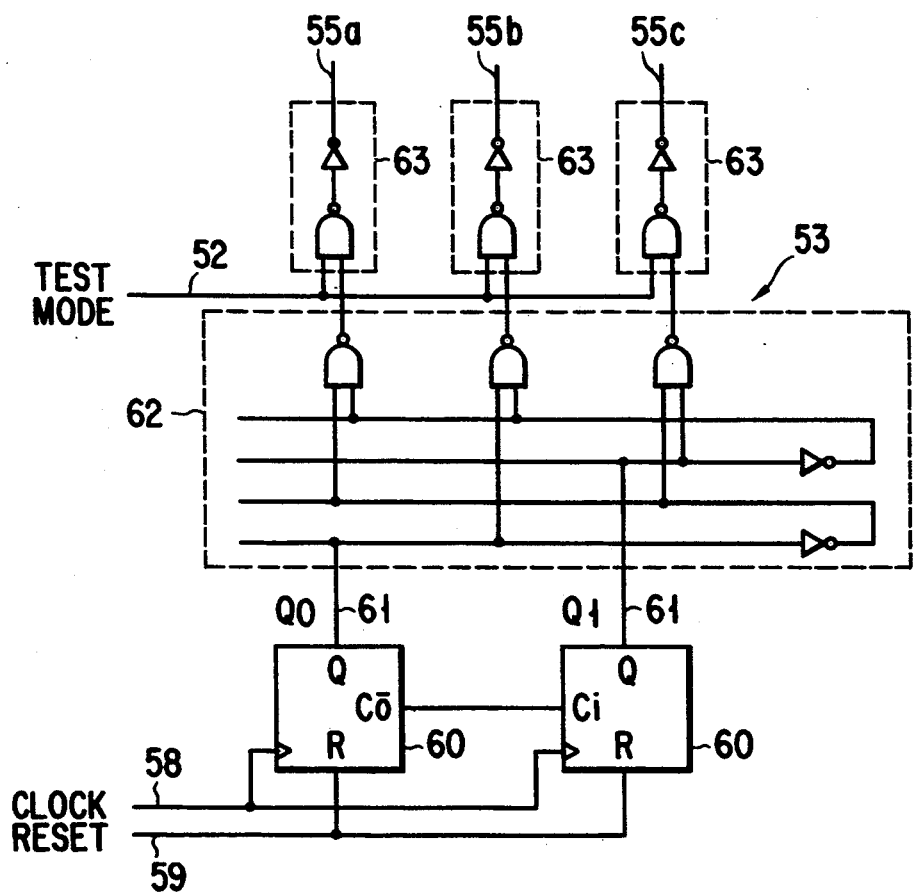
FIG. 11 Shows a circuit diagram of the sequential select circuit in the semiconductor device of FIG. 9.

FIG. 11 is a detailed circuit diagram of the sequential select circuit 53 of FIG. 9. The clock signal via the clock signal line 58 and the reset signal via the reset signal line 59 are supplied to a resettable binary counter 60. The resettable binary counter 60 is interconnected by sequential carry signals, starting at the least-significant bit toward the most-significant bit. The binary counter output signal 61 is supplied to a decoder circuit 62 composed of a 2-input NAND and an inverter. The output signal of the decoder circuit 62 is supplied, together with the test mode signal supplied via the input signal line 52, to a 2-input NAND circuit 63. The output of the 2-input NAND circuit 63 is supplied as a sequential select signal via the first, second, and third sequential select lines 55a, 55b, and 55c.

In FIG. 11, in an operation except for a test, when the test mode signal is low, the 2-input AND circuit 63 makes the sequential select signal low, which is a selected state, irrespective of the output signal of the decoder circuit 62. During a test, when the test mode signal is high, the 2-input AND circuit 63 acts just as an ordinary buffer, allowing the output signal from the decode circuit 62 to be buffered and supplied as a sequential select signal. The resettable binary counter 60 is reset by the reset signal and performs a count operation with the clock signal. Since the output signal from the decoder circuit 62 is a signal obtained by decoding the counter output, only the selected sequential select signal is made low, and the other signals, or the unselected signals are made high. The selected signal is shifted in sequence each time the resettable binary counter 60 counts with the clock signal: the sequential select signal via the first sequential select signal line 55a, the sequential select signal via the second sequential select signal line 55b, and the sequential select signal via the third sequential select signal line 55c are selected one after another in that order.

Figure 12:
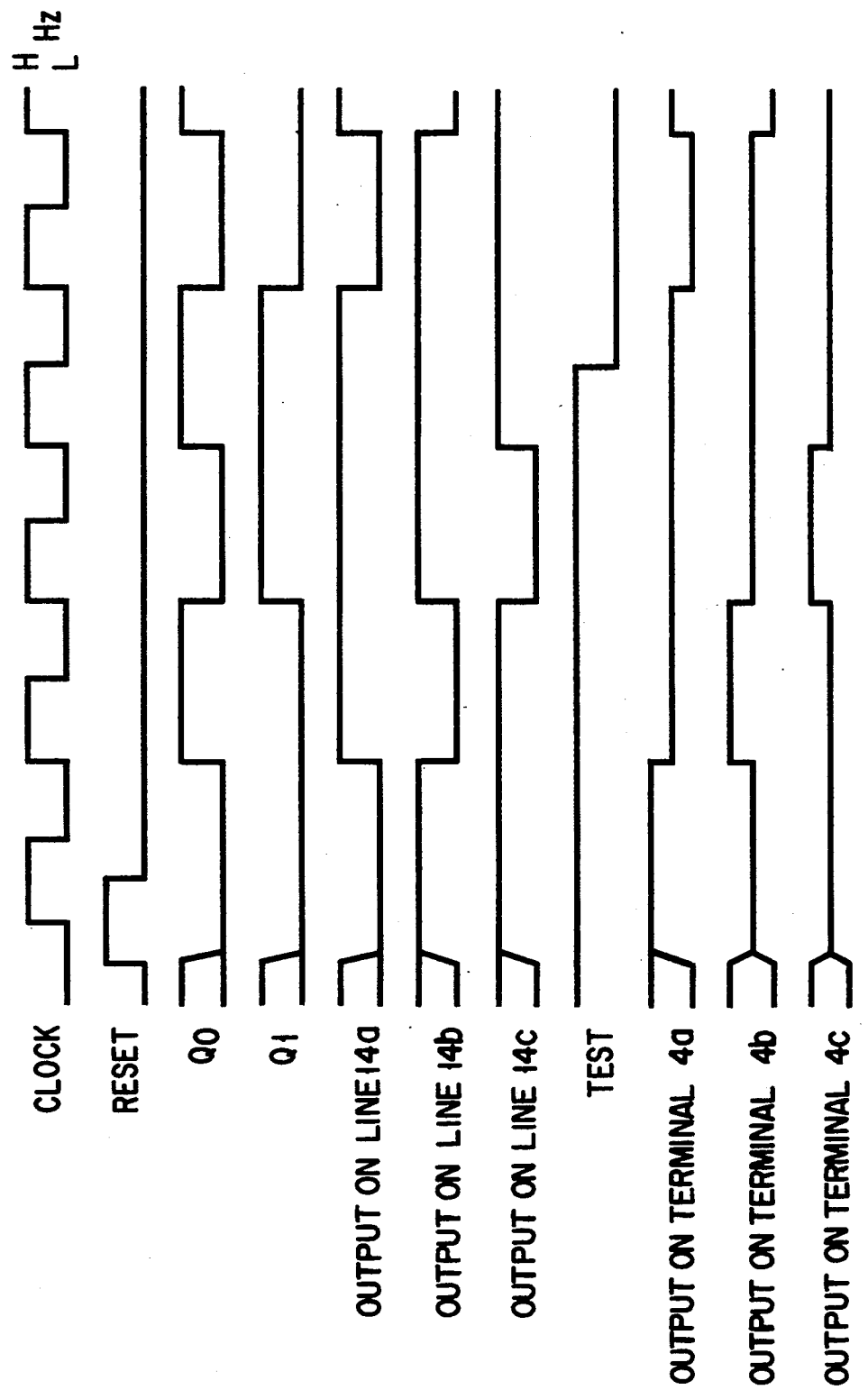
FIG. 12 shows a signal chart of the operation of the semiconductor device of FIGS. 9, 10 and 11.

FIG. 12 is a waveform diagram for explaining the operation of the embodiments shown in FIGS. 9, 10, and 11. Those waveforms take place when the test mode signal is high, or during a test. When the reset signal becomes high, the binary counter 60 is initialized, with the result that its output is low. The binary counter 60, after the reset signal has become low, starts to count when the clock signal rises. Then, the output terminal selected by the decoder circuit 62 is placed in a normal output state, supplying a high output according to the high test signal. The unselected output terminals are brought into a high impedance state. The selected output terminal is switched to another each time the clock signal arrives. After the first through third output terminals have been tested, the test signal is made low, or the expected value is made low, and then another test is started.

In the operation shown in FIG. 12, each of the output buffers is tested with regard to a high logic level data when said each of the output buffers is first selected, and tested with regard to a low logic level data when said each of the output buffers is second selected. However, the test scheme is not limited to this. Each of the output buffers may be tested with regard to a high logic level data and a low logic level data in series when said each of the output buffers is once selected.

Figure 13:
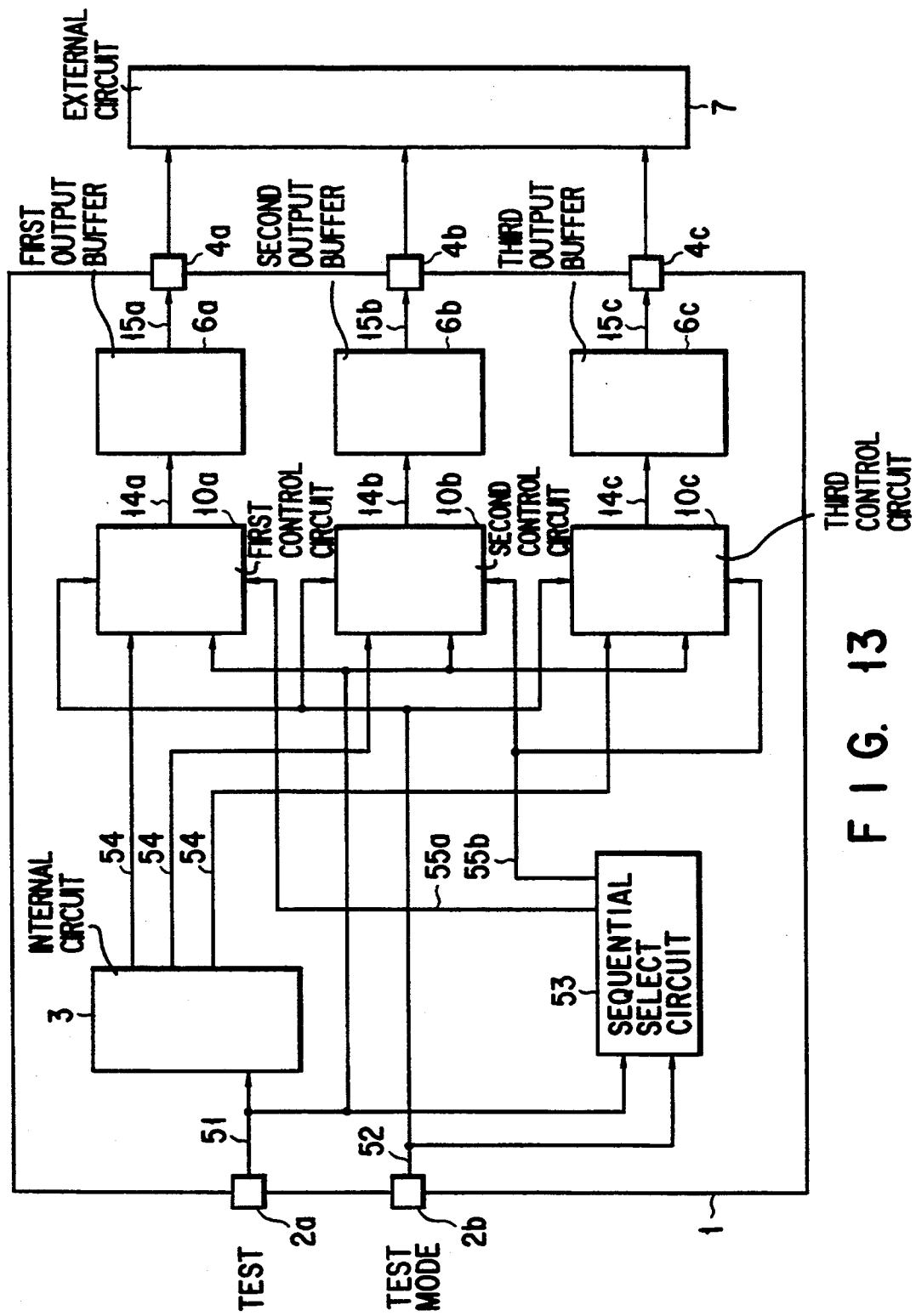
FIG. 13 shows a block diagram of an integrated circuit semiconductor device of a further embodiment according to the present invention.

FIG. 13 is a block diagram of still another embodiment of the present invention. The test signal supplied from a first input terminal 2a to an IC 1 is supplied via an input signal line 51 to an internal circuit 3, a first, second, and third control circuits 10a, 10b, and 10c, and a sequential select circuit 53. The test mode signal from a second input terminal 2b is supplied via an input signal line 52 to the first, second, and third control circuits 10a, 10b, and 10c and the sequential select circuit 53. The internal circuit output signal from the internal circuit 3 is supplied via an internal circuit output signal line 54 to the first, second, and third control circuits 10a, 10b, and 10c. The sequential select signal from the sequential select circuit 53 is supplied to the first control circuit 10 via a first sequential select signal line 55a, and to the second and third control circuits 10b and 10c via a second sequential select signal line 55b. The control circuit output signals from the first, second, and third control circuits 10a, 10b, and 10c are supplied to a first, second, and third output buffers 6a, 6b, and 6c via a first, second, and third control circuit output signal lines 14a, 14b, and 14c, respectively. The outputs of the first, second, and third output buffers 6a, 6b, and 6c are supplied via a first, second, and third output signal lines 15a, 15b, and 15c to a first, second, and third output terminals 4a, 4b, and 4c, from which the outputs are then supplied to an external circuit 7.

In the embodiment of FIG. 13, the sequential select circuit 53 produces two sequential select signals: one is supplied to both the second and third control circuits 10b and 10c via the second sequential select signal line 55b, and the other is supplied to the first control circuit 10a via the first sequential select signal line 55a. In this way, depending on the value of the output current produced by the output buffer 6a, 6b or 6c, more than one multiple output buffer or terminal can be placed in a normal operation state simultaneously. Therefore, the second and third output buffers 6b and 6b, which are small current buffers, may be allowed to undergo an electric characteristics test simultaneously, whereas the first output buffer 6a, which is a large current buffer, may be permitted to undergo an electric characteristics test independently.

FIG. 14 is a detailed circuit diagram of the sequential select circuit 53 of FIG. 13. A ring counter 66 is composed of a resettable shift register 64 and a settable/resettable shift register 65. The ring counter 66 operates using the test signal supplied via an input signal line 51 as a clock. The test mode signal supplied via the input signal line 52 is used as the set and reset signal for the ring counter. The outputs of the settable/resettable shift registers 65 are supplied as sequential select signals via a first and second sequential select signal lines 55a and 55b, and at the same time, supplied to a subsequent-stage shift register constituting the ring counter 66. The resettable shift register 64 is provided to make it easy to determine the initial value for the ring counter 66.

It is assumed that the low sequential select signal from the FIG. 14 circuit is the selective signal and the high sequential select signal is the unselective signal. During a test, the test mode signal is made high to produce a pulse signal from its rising edge. The pulse signal is used to reset the resettable shift register 64 and set the settable/resettable shift register 65 in order to bring the output, a sequential select signal, into an unselected state or a high level. After the initial value has been set, switching the test signals supplied via the input line 51 causes the ring counter 66 to operate, which sequentially changes the terminal selected. When the test signals have been changed, the output of the output terminal selected is changed from high to low and then, the next terminal is selected. To test the next terminal with the output fixed, the clock signal to the ring counter 66 should be made different from the test signal. During a normal operation, the test mode signal is made low to reset the settable/resettable shift register 65 in order to place its output, a sequential select signal, at a low level, or in a selected state.

FIG. 15 is a signal waveform diagram for explaining the operation of the embodiment of FIGS. 13 and 14. When the test mode signal is low, the sequential select signal is low, with the result that a signal according to the output signal from the internal circuit 3 appears at the output terminal 4. When the test mode signal becomes high, a set pulse is created from its rising edge. The pulse is used to initialize the ring counter 66, which makes all the sequential select signals high, bringing the first, second, and third output terminals 4a, 4b, and 4c into a high impedance state. At this point in time, the high impedance characteristic of all the output terminals may be measured. After the set pulse have become low, the rising edge of the first test signal starts the operation of the ring counter 66, which makes the first sequential select signal via the first sequential select line 55a low. The output from the first output terminal 4a selected by the signal becomes high according to the test signal. The unselected second and third output terminals 4b and 4c remain in a high impedance state. When the test signal becomes low, the output from the first output terminal 4a selected becomes low. This completes the measurement of the first output terminal 4a. When another test signal rises, a subsequent output terminal is then selected, followed by the same operation.

As explained above, according to the embodiments of FIGS. 9 through 17, an accurate test can be conducted without impairing the ease of setting the expected value for the output buffers or terminals. Sequential switching of the output terminals to be selected enables all the output terminals to be tested easily.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
   an internal circuit;
   output buffer means including at least a first independent output buffer and a second independent output buffer both coupled between the internal circuit and an output terminal from which an output signal is supplied to an external circuit to match the internal circuit with said external circuit; and
   a control circuit coupled between the internal circuit and the output buffer means, for switching between the first and second output buffers.

2. A semiconductor integrated circuit device according to claim 1, wherein said first output buffer has a greater current driving ability than that of said second output buffer.

3. A semiconductor integrated circuit device according to claim 1 or 2, wherein said first buffer is composed of a Bi-CMOS circuit and said second output buffer is composed of a CMOS circuit.

4. A semiconductor integrated circuit device according to claim 1, wherein said first output buffer is actuated by a first power supply voltage and said second output buffer is actuated by a second power supply voltage different from said first power supply voltage.

5. A semiconductor integrated circuit device comprising:
   an internal circuit;
   output buffer means including at least a first independent output buffer and a second independent output buffer both coupled between the internal circuit and an output terminal from which an output signal is supplied to an external circuit to match the internal circuit with said external circuit; and
   a control circuit coupled between the internal circuit and the output buffer means, for switching between the first and second output buffers;
   wherein said first output buffer is actuated by a first power supply voltage and said second output buffer is actuated by a second power supply voltage different from said first power supply voltage.

6. A semiconductor integrated circuit device according to claim 5, wherein said first output buffer has a greater current driving ability than that of said second output buffer.

7. A semiconductor integrated circuit device according to claim 5, wherein said first buffer is composed of a Bi-CMOS circuit and said second output buffer is composed of a CMOS circuit.

* * * * *